(12) United States Patent
Huang et al.

(10) Patent No.: US 7,489,909 B2
(45) Date of Patent: *Feb. 10, 2009

(54) METHOD AND APPARATUS FOR CONTROLLING A TX POWER AMPLIFIER

(75) Inventors: Shine C. Huang, Yung-Ho (TW); Ping-Chun Lin, Jhubei (TW)

(73) Assignee: MediaTek Incorporation (TW)

(*) Notice: Subject to any disclaimer, the term of this patent is extended or adjusted under 35 U.S.C. 154(b) by 530 days.

This patent is subject to a terminal disclaimer.

(21) Appl. No.: 11/147,152

(22) Filed: Jun. 6, 2005

(65) Prior Publication Data

US 2005/0281353 A1 Dec. 22, 2005

(51) Int. Cl.
*H01Q 11/12* (2006.01)
*H04B 1/04* (2006.01)

(52) U.S. Cl. .................. 455/91; 455/127.1; 455/522

(58) Field of Classification Search ... 455/127.1–127.5, 455/522; 370/337, 345, 347
See application file for complete search history.

(56) References Cited

U.S. PATENT DOCUMENTS

| | | | |
|---|---|---|---|
| 5,357,513 A | 10/1994 | Kay et al. | |
| 5,491,837 A | 2/1996 | Haartsen | |
| 5,675,611 A * | 10/1997 | Lehtinen et al. | 375/297 |
| 5,809,017 A | 9/1998 | Smith et al. | |
| 5,854,784 A | 12/1998 | Solve et al. | |
| 5,970,406 A | 10/1999 | Komara | |
| 6,002,673 A | 12/1999 | Kahn et al. | |
| 6,044,069 A | 3/2000 | Wan | |
| 6,072,788 A | 6/2000 | Peterson et al. | |
| 6,072,792 A * | 6/2000 | Mazur et al. | 370/345 |
| 6,084,868 A * | 7/2000 | Piirainen | 370/345 |
| 6,101,171 A | 8/2000 | Yoshida et al. | |
| 6,314,081 B1 | 11/2001 | Chennakeshu et al. | |
| 6,430,402 B1 | 8/2002 | Agahi-Kesheh | |
| 6,442,146 B1 | 8/2002 | Onodera et al. | |
| 6,463,073 B1 | 10/2002 | Bontu et al. | |
| 6,490,261 B1 | 12/2002 | Dent et al. | |
| 6,529,494 B1 * | 3/2003 | Ostman et al. | 370/337 |
| 6,563,884 B1 | 5/2003 | Nikula | |
| 6,667,965 B1 | 12/2003 | Yamaura et al. | |
| 6,680,920 B1 | 1/2004 | Wan | |
| 6,842,438 B1 | 1/2005 | Benedict et al. | |
| 7,010,057 B2 * | 3/2006 | Vayrynen et al. | 375/295 |

(Continued)

FOREIGN PATENT DOCUMENTS

CN 1592121 A 3/2005

(Continued)

*Primary Examiner*—Simon D Nguyen
(74) *Attorney, Agent, or Firm*—Andrew D. Fortney

(57) ABSTRACT

A method and an apparatus for controlling a TX power amplifier are provided. The method is for generating a power control curve in an inter-slot region between two continuous or adjacent time slots, which respectively have different modulation types. The method and apparatus produces a concave inter-slot ramp control curve for reducing the power of the TX power amplifier in the inter-slot region, where the power for signal transmission is transformed from a first power value K1 to a second power value K2. The method and apparatus further estimates a transient period of the concave inter-slot ramp control curve, during which modulation switching of the TX power amplifier may occur.

36 Claims, 14 Drawing Sheets

U.S. PATENT DOCUMENTS

| | | |
|---|---|---|
| 7,146,142 B1 | 12/2006 | Raaf |
| 7,257,096 B2 | 8/2007 | Kim |
| 2003/0114124 A1* | 6/2003 | Higuchi ........................ 455/126 |
| 2003/0160654 A1 | 8/2003 | Fischer et al. |
| 2003/0198300 A1 | 10/2003 | Matero et al. |
| 2004/0038701 A1* | 2/2004 | Lin ............................ 455/522 |
| 2004/0208157 A1* | 10/2004 | Sander et al. ............... 370/345 |
| 2004/0266369 A1 | 12/2004 | McCallister |
| 2005/0018780 A1 | 1/2005 | Kim |
| 2005/0054308 A1 | 3/2005 | Vayrynen et al. |
| 2005/0266811 A1 | 12/2005 | Weiss |
| 2006/0189285 A1 | 8/2006 | Takano et al. |
| 2007/0129096 A1 | 6/2007 | Okumura et al. |

FOREIGN PATENT DOCUMENTS

| | | |
|---|---|---|
| WO | WO 97/23062 | 6/1997 |

* cited by examiner

METHOD AND APPARATUS FOR CONTROLLING A TX POWER AMPLIFIER

This application claims the benefit of Taiwan application Serial No. 93117810, filed Jun. 18, 2004, and U.S. application Ser. No. 11/047,032, filed Jan. 31, 2005, and Ser. No. 11/124,476, filed May 6, 2005, the subject matter of each of which is incorporated herein by reference.

BACKGROUND OF THE INVENTION

1. Field of the Invention

The invention relates in general to a method and an apparatus for controlling a TX power amplifier, and more particularly to a method and an apparatus for controlling a TX power amplifier applied in a wireless communication system.

2. Description of the Related Art

A wireless communication system is used for transmitting data through the air to a remote end. The TX power amplifier (TX PA) amplifies the power of signals in order to prevent signals from being weakened to be indistinguishable noise before the signals reach the target remote end. Generally speaking, the power of the TX PA for signal transmission is increased to a predetermined amplitude before the signal transmission. The process of power increment occurs in a ramp-up division. After the signal transmission, the power of the TX PA for signal transmission is decreased to a minimum amplitude. The process of power decrement occurs in a ramp-down division.

The Time Division Multiple Access (TDMA) system takes one time slot as a unit for transmitting/receiving data. Any two cellular phones will not transmit data in the same time slot (namely, the same time, the same frequency) so as to avoid interferences. Further, the rear portion of a time slot and the front portion of a subsequent time slot are defined as a guard area, and no data transmission occurs in the guard area so as to avoid interferences. Moreover, data for multiple time slots can be continuously transmitted in the TDMA system, and the transmission power for each of the time slots may be varied. When the TDMA system continuously transmits data for multiple time slots, it has to perform the power transformation in the guard area between two continuous time slots. The process of power transformation occurs in an inter-ramp division.

No matter the power amplitudes for two continuous time slots S1 and S2 are progressively increasing, progressively decreasing, or constant, in the TDMA system, the power control curve, representing the power variation of the conventional TX power amplifier for signal transmission, is linear in the ramp-up division, ramp-down division, and inter-ramp division.

Referring to FIGS. 1A to 1C, the timing charts show the variation of power amplitude of a conventional TX power amplifier for signal transmission when continuously transmitting data for two time slots in the TDMA system. As shown in FIG. 1A, the power amplitudes for two continuous time slots S1 and S2 are progressively increased. The inter-ramp control curve IRa is a linear increasing line, and the power amplitudes in the inter-ramp division are greater than the power amplitude of the time slot S1 and less than the power amplitude of the time slot S2. As shown in FIG. 1B, the power amplitudes for two continuous time slots S1 and S2 are progressively decreased. The inter-ramp control curve IRb is a linear decreasing line, and the power amplitudes in the inter-ramp division are less than the power amplitude of the time slot S1 and greater than the power amplitude of the time slot S2. As shown in FIG. 1C, the power amplitudes for two continuous time slots S1 and S2 are constant. The inter-ramp control curve IRc is a horizontal line, and the power amplitudes in the inter-ramp division are the same as the power amplitudes of the time slot S1 and S2. Furthermore, the ramp-up control curve RUa, RUb and RUc are linear increasing lines while the ramp-down control curve RDa, RDb and RDc are linear decreasing lines.

Conventionally, for the ramp-up and ramp-down divisions, the TDMA system has to store the ramp-up control curves and ramp-down control curves corresponding to various power amplitudes in the memory, requiring a large memory space, and applies linear operations for generating inter-ramp control curves for the TX PA. Because the ramp-up control curves and ramp-down control curves are stored in the memory, the conventional approach is able to rapidly generate a power control curve by accessing the memory, but it takes large memory to store a large amount of ramp-up control curves and ramp-down control curves. For the inter-ramp division, because there are many possible combinations of power amplitudes for two continuous time slots, there are too many inter-ramp control curves to store in the memory. Furthermore, in consideration of the operational complexity, the conventional approach generates the inter-ramp control curves for the TX PA by applying simple linear operations.

However, a very large proportion of the power consumption for the whole system is generally resulted from the power consumption of the TX PA. In particular, the larger the signal transmission power is, the larger the power consumption is. In the design of linear connection of two continuous time slots, even though the TX PA does not transmit any data in the inter-ramp division, it still consumes a lot of power.

SUMMARY OF THE INVENTION

It is therefore an object of the invention to provide a method and an apparatus for controlling a TX power amplifier. Saving power is achieved by reducing the power amplitude in the guard area. Besides, it requires less memory space for storing and less time for calculating and generating a TX PA power control curve.

The invention achieves the above-identified object by providing a power controlling method, which is applied to a TX power amplifier for controlling power of a signal to-be-transmitted. The method produces a power control curve in a power variation area, having at least one transmission power value K, to control the power variation of the signal. The method includes the following steps. An original curve is first generated according to the transmission power value K, and the original curve is horizontally and equally divided into an original left section FL and an original right section FR. Then, a lowest power value H of the power variation area is determined according to the transmission power value K. A left section ratio SL and a right section ratio SR are determined according to the transmission power value K and the lowest power value H. Besides, a left section FL' of the power control curve is calculated and generated according to the lowest power value H, the original left section FL and the left section ratio SL while a right section FR' of the power control curve is calculated and generated according to the lowest power value H, the original right section FR and the right section ratio SR. Lastly, the power control curve in the power variation area is produced according to the left section FL' and the right section FR' so as to control the power variation of the signal.

The invention achieves the above-identified object by further providing a power controlling apparatus, installed in a wireless communication apparatus, for producing a power control curve in a power variation area, having at least one transmission power value K, to control the power variation of the signal. The apparatus includes a power amplifier and a memory. The power amplifier controls power of a signal to-be-transmitted according to the power control curve. The memory includes an original left section table, an original right section table, a lowest power value table, a left section ratio table, and a right section ratio table. The original left section table stores several original left sections, each of which corresponds to one transmission power value. The original right section table stores several original right sections, each of which corresponds to one transmission power value. The lowest power value table stores several lowest power values, each of which corresponds to one transmission power value. The left section ratio table stores several left section ratios, each of which corresponds to one transmission power value and one lowest power value. The right section ratio table stores several right section ratios, each of which corresponds to one transmission power value and one lowest power value. By performing the following, the power control curve is produced. First, an original curve is generated according to the transmission power value, by searching the original left section table and the original right section table to obtain a corresponding original left section and a corresponding original right section so as to produce the original curve. Then, according to the transmit power value K, the lowest power value table is searched to obtain a corresponding lowest power value H of the power variation area. Next, according to the transmission power value K and the lowest power value H, a left section ratio SL and a right section ratio SR are determined by using the left section ratio table and the right section ratio table. Then, according to the lowest power value H, the original left section FL and the left section ratio SL, a left section FL' of the power control curve is calculated and generated, and according to the lowest power value H, the original right section FR and the right section ratio SR, a right section FR' of the power control curve is calculated. Finally, according to the left section FL' and the right section FR', the power control curve is generated in the power variation area for controlling the power variation of the signal.

Other objects, features, and advantages of the invention will become apparent from the following detailed description of the preferred but non-limiting embodiment. The following description is made with reference to the accompanying drawings.

DETAILED DESCRIPTION OF THE INVENTION

The invention is applied to a TX power amplifier for controlling power of a signal to-be-transmitted. The invention is aimed at producing a power control curve in a power variation area for controlling power variation of the signal, thereby reducing the power consumption. The power variation area has at least one transmission power value K and can be divided into a ramp-up division, an inter-ramp division, and a ramp-down division. The power control curve is produced according to the transmission power value K, an original curve, and a lowest power value H. The original curve is generated according to the transmission power value K and is horizontally and equally divided into an original left section FL and an original right section FR. Then, a lowest power value H of the power variation area is determined according to the transmission power value K. A left section ratio SL and a right section ratio SR are determined according to the transmit power value K and the lowest power value H. Besides, a left section FL' of the power control curve is calculated according to the lowest power value H, the original left section FL and the left section ratio SL while a right section FR' of the power control curve is calculated according to the lowest power value H, the original right section FR and the right section ratio SR. Lastly, according to the left section FL' and the right section FR', the power control curve in the power variation area is produced for controlling the power variation of the signal.

Figure 4A:
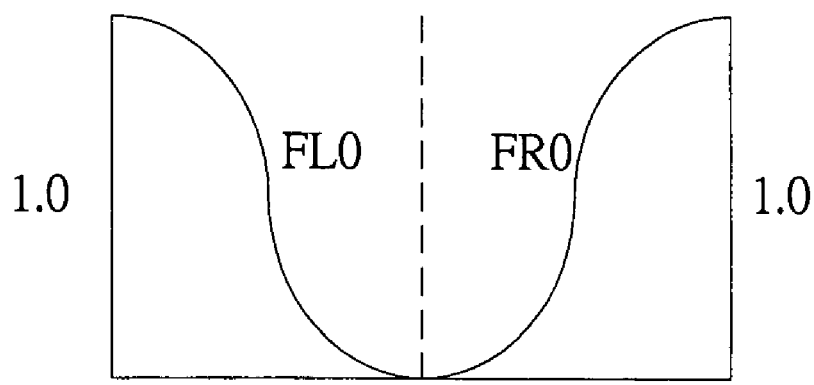
FIG. 4A shows an original inter-ramp curve according to a preferred embodiment of the invention.
Figure 5A:
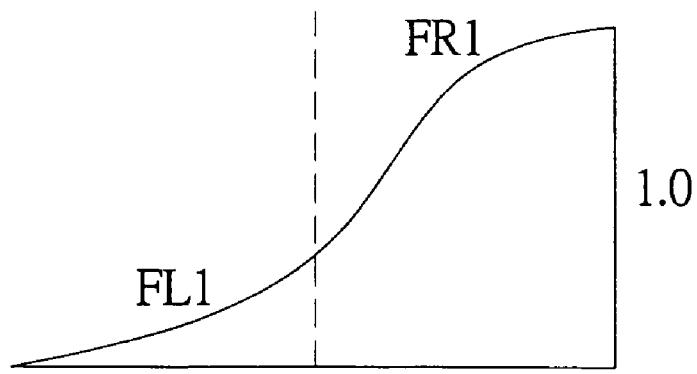
FIG. 5A shows an original ramp-up curve according to a preferred embodiment of the invention.
Figure 6A:
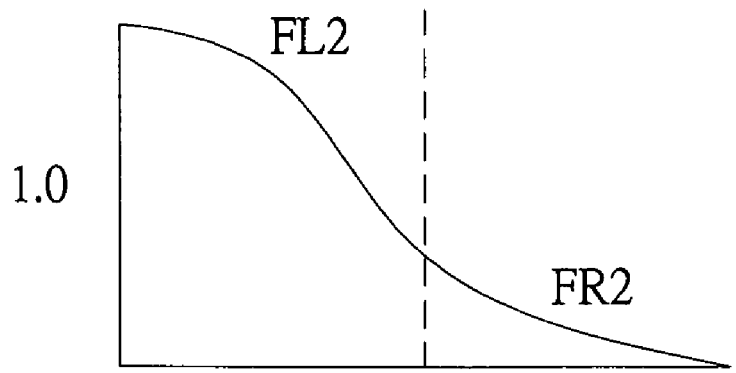
FIG. 6A shows an original ramp-down curve according to a preferred embodiment of the invention.

The power control curve consists of a ramp-up control curve, a ramp-down control curve, and an inter-ramp control curve. The ramp-up control curve corresponds to the ramp-up division of the power control curve, the ramp-down control curve corresponds to the ramp-down division of the power control curve, and the inter-ramp control curve corresponds to the inter-ramp division of the power control curve. In FIG. 5A, a left end of the original left section FL1 of the ramp-up control curve is a lowest point thereof, and a right end of the original right section FR1 of the ramp-up control curve is a highest point thereof. Besides, the original left section FL1 is connected with the original right section FR1. In FIG. 6A, a left end of the original left section FL2 of the ramp-down control curve is a highest point thereof, and a right end of the original right section FR2 of the ramp-down control curve is a lowest point thereof. Besides, the original left section FL2 is connected with the original right section FR2. In FIG. 4A, a left end and a right end of the original left section FL0 of the inter-ramp control curve are respectively a highest point and a lowest point thereof, and a left end and a right end of the original right section FR0 of the inter-ramp control curve are respectively a lowest point and a highest point thereof.

It is noted that each slot has a data area and a guard area is located between the data areas between two adjacent slots. In some embodiments, the output power curve is formed at the guard area. The feature of the invention employs the special property of no data transmission occurring in the guard area to design the inter-ramp control curve as a curve (preferably a concave curve) so as to reduce the power amplitude in the guard areas for saving power. The width of the concave curve could be predetermined according to user's needs. Preferably, the width of the concave curve should be less than a quarter of the duration of a slot.

Moreover, it should be further noted that the output concave curve is generated according to an original power curve (the original curve). The original power curve could be a polynomial or a cosine function pre-stored in a memory. The memory may have a table for storing and/or recording all control information regarding the original power curve. In some embodiments, the original power curve could be expressed as $[1+COS(2\pi*n/N)]/2$, where n and N are the control information used to generate the original power curve. However, the present invention is not limited thereto. Any other concave, linear or non-linear curve could be the original power curve in the present invention.

Notwithstanding there are many possible combinations of the power amplitudes for two adjacent time slots and the invention can be applied in the condition that data for any two adjacent time slots is continuously transmitted, the following embodiment directed to the continuous transmission of data for two time slots in a fixed frequency is for further description.

Figure 1A:
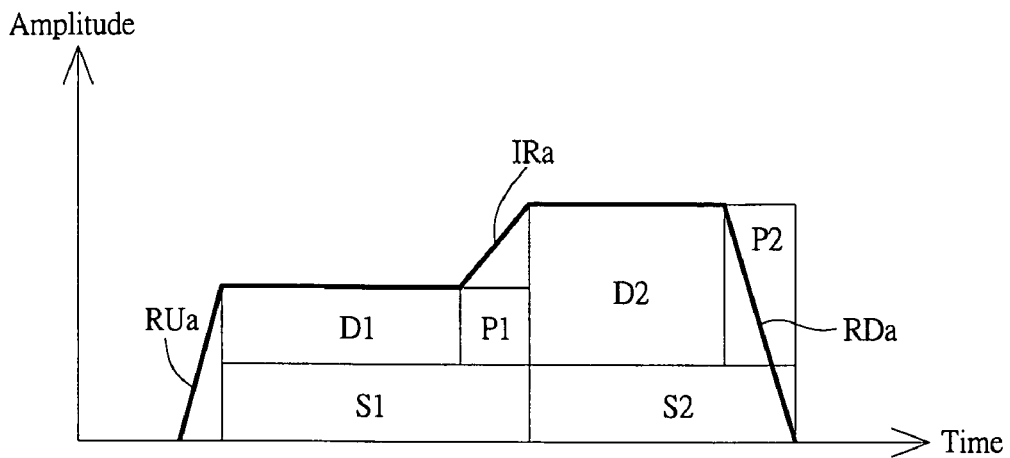
FIGS. 1A-1C (Prior Art) are timing charts showing the variation of the power amplitude of a conventional TX power amplifier when continuously transmitting data of two time slots in the TDMA system.
Figure 1B:
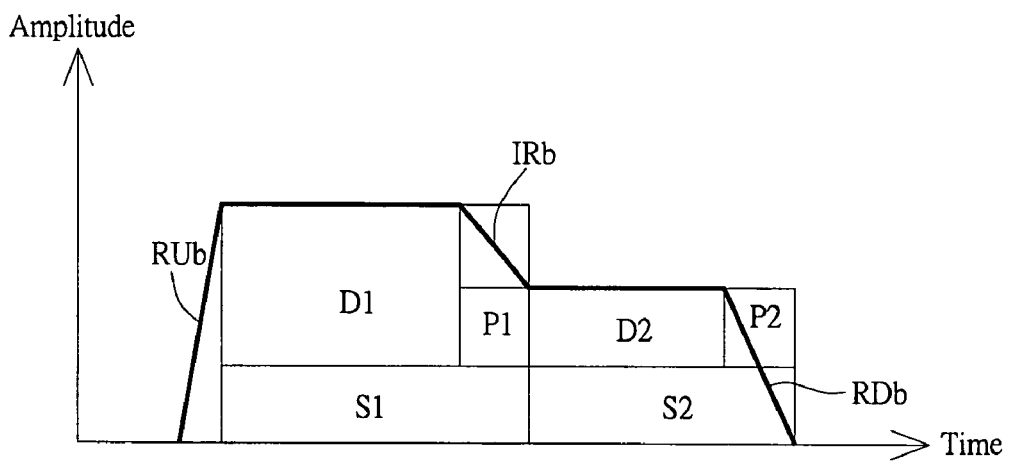
Figure 1C:
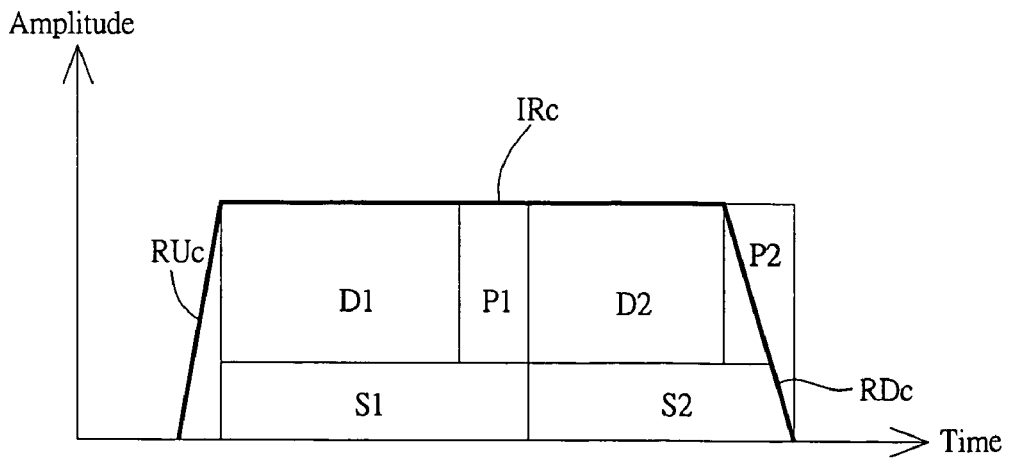
Figure 2:
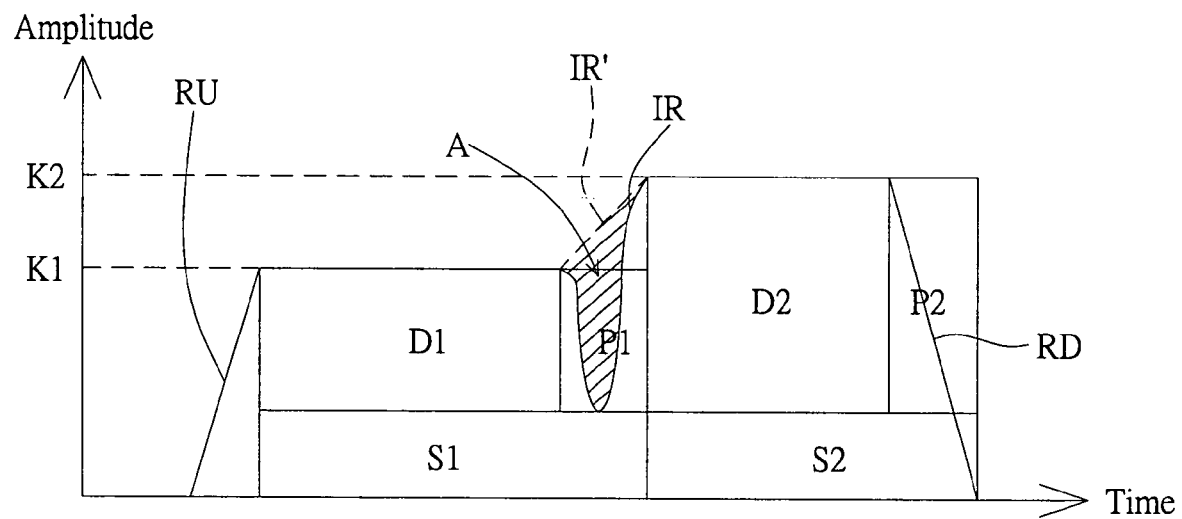
FIG. 2 is a timing chart showing the variation of the power amplitude of a TX power amplifier when continuously transmitting data of two time slots according to a preferred embodiment of the invention.

Referring to FIG. 2, a timing chart showing the variation of the power amplitude of a TX power amplifier when continuously transmitting data of two time slots according to a preferred embodiment of the invention is provided. The rear portions of the two continuous first slot S1 and second slot S2 are respectively set as a first guard area P1 and a second guard area P2, where no data transmission occurs. Specifically, the data transmission only occurs in the first data area D1 and the second data area D2, not in the first guard area P1 and a second guard area P2. The ramp-up control curve RU illustrates that the power of the TX PA for signal transmission is increased from 0 to a first transmission power value K1 before the TX PA transmits signals in the first data area D1. The ramp-down control curve RD illustrates that the power of the TX PA for signal transmission is decreased from the second transmission power value K2 to the minimum amplitude after the TX PA transmits signals in the second data area D2. As for the inter-ramp control curve IR, it illustrates that the power transformation has to occur in the guard area P1, which is positioned between the two continuous time slots, the first time slot S1 and the second time slot S2. The inter-ramp control curve nonlinearly connects the first transmission power value K1 and the second transmission power value K2 for transforming the power of the TX PA for signal transmission. The inter-ramp control curve may comprise a concave curve so as to reduce the power amplitude in the guard area P1 and save power.

As shown in FIG. 2, the area A surrounded by the inter-ramp control curve IR, having the concave shape, and the inter-ramp control curve IR' of the prior art is the amount of the saved power by applying the present invention, as compared with the conventional TX power amplifier. Besides, no matter the first transmission power value K1 is greater than, equal to, or smaller than the second transmission power value K2, the design of the concave curve according to the invention for reducing the power amplitude in the guard area P1 can effectively save power. In some embodiments, the present method of controlling output power of a device in a multi-slot wireless communication system comprises the steps of providing a first power value SL at a first time point in a first slot; providing a second power value SR at a second time point in a second slot, wherein the second slot is adjacent to the first slot; providing at least one original power curve; generating an output power curve according to the original power curve between the first time point and the second time point, wherein at least one power value Q of the output power curve is substantially less than the first power value SL and the second power value SR; and then adjusting the output power according to the output power curve.

In some embodiments, the original power curve can include a first power curve FL(t) and a second power curve FR(t) and the output power curve has a first portion FL'(t) and a second portion FR'(t). Here, the output power curve may be generated according to the following equation: FL'(t)=H+FL(t)*SL'; and FR'(t)=H+FR(t)*SR', wherein SL'=SL−H, SR'=SR−H, and H is a predetermined value. Here, H may be the lowest power value of the output power curve. Alternatively, H could be equal to the power value Q. Preferably, the power value Q is approximately 0, or at least about 6 dBm less than the first power value SL and the second power value SR (e.g., the lower of the first power value SL and the second power value SR).

It should be noted that the multi-slot wireless communication system could be any TDMA communications, such as GSM, GPRS, and/or EDGE system. The device could be a transmission power amplifier of a mobile phone.

Figure 3:
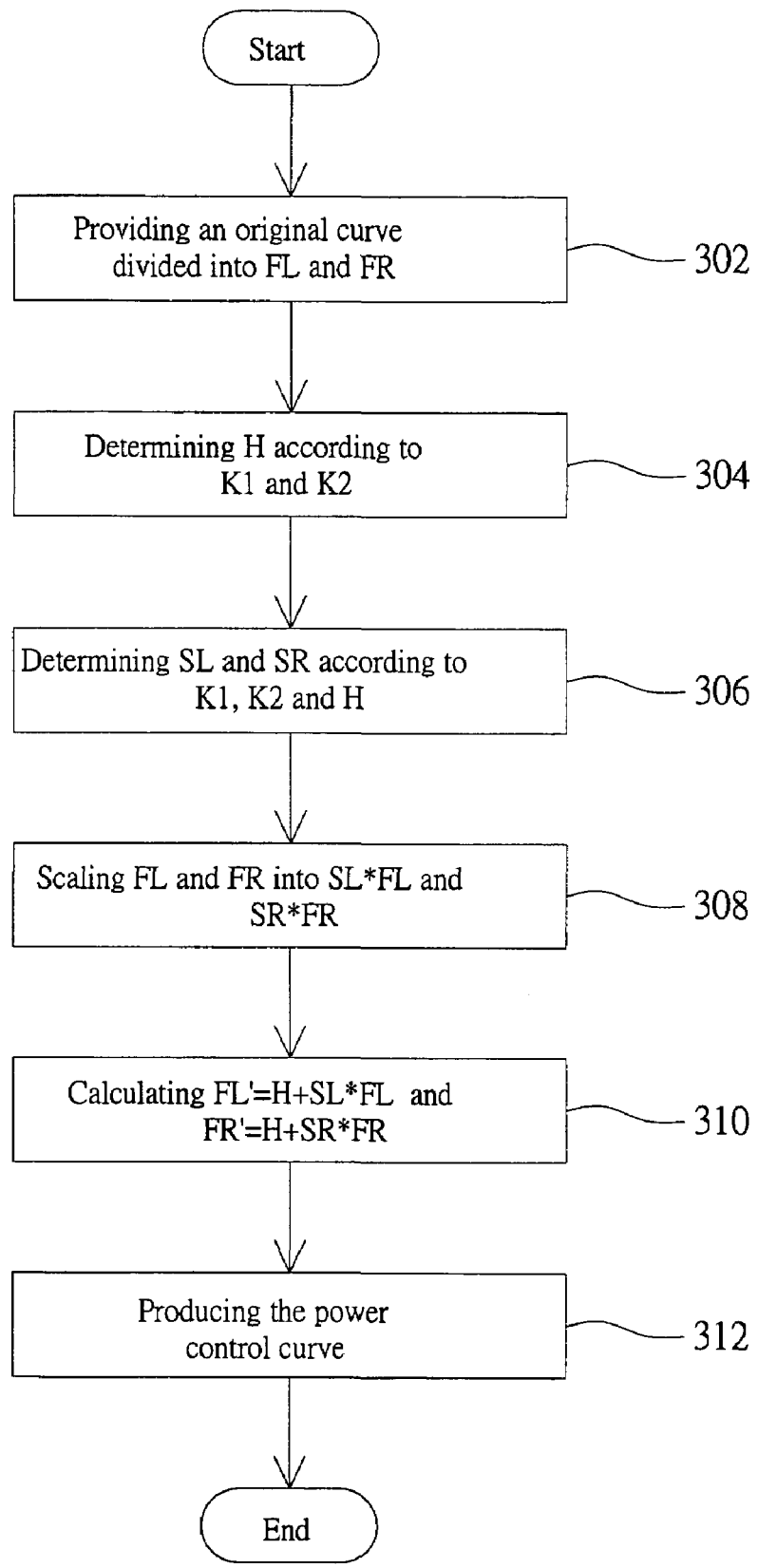
FIG. 3 shows a power controlling method for a TX power amplifier according to a preferred embodiment of the invention.

Referring to FIG. 3, a power controlling method for a TX power amplifier is shown. The TX power amplifier transmits data during two continuous slots with a first transmission power value K1 and a second transmission power value K2 respectively. The method starts with step 302 to provide an original curve. The original curve is horizontally and equally divided into an original left section FL and an original right section FR. Then, at step 304, a lowest power value H of the power variation area is determined according to the first transmission power value K1 and the second transmission power value K2. At step 306, a left section ratio SL and a right section ratio SR are determined according to the first transmission power value K1, the second transmission power value K2 and the lowest power value H. As shown in step 308, the original left section FL is scaled into SL*FL according to the left section ratio SL, and the original right section FR is scaled into SR*FL according to the right section ratio SR. Step 310 calculates a left section FL' and a right section FR' of the power control curve, which satisfy FL'=H+SL*FL and FR'=H+SR*FR. Lastly, at step 312, the power control curve in the power variation area is produced according to the left section FL' and the right section FR'.

In accordance with the above-mentioned steps, the inter-ramp control curve, the ramp-up control curve, and the ramp-down control curve can be respectively generated. In particular, the power controlling method for the power amplifier according to the invention produces a concave inter-ramp control curve for controlling the power variation in the inter-ramp division, making the power amplitude nonlinearly transformed from the first transmission power value K1 to the second transmission power value K2. Further, the ramp-up control curve is produced for controlling the power variation in the ramp-up division, which is progressively increased from the lowest power value H to the first transmission power value K1. In addition, a ramp-down control curve is produced for controlling the power variation in the ramp-down division, which is progressively decreased from the second transmission power value K2 to the lowest power value H.

Figure 4B:
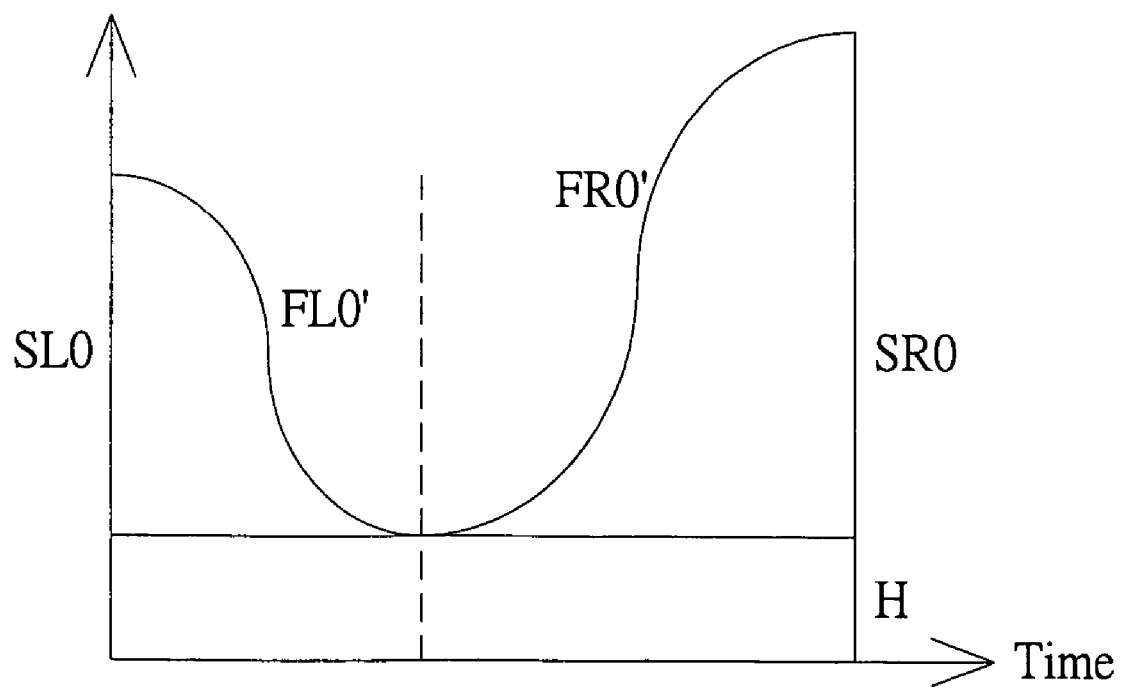
FIG. 4B shows an inter-ramp control curve according to a preferred embodiment of the invention.

Referring to FIGS. 4A and 4B, the original inter-ramp curve and the inter-ramp control curve according to a preferred embodiment of the invention are shown. The inter-ramp control curve is a concave curve and produced by the following steps. The original inter-ramp curve is first provided and is horizontally and equally divided into an original inter-ramp left section FL0 and an original inter-ramp right section FR0. As shown in FIG. 4A, the contours of the original inter-ramp left section FL0 and the original inter-ramp right section FR0 are unnecessary to be symmetric but have to correspond with the standard scopes of time domain and the frequency spectrum in order to avoid interference. The original inter-ramp left section FL0 nonlinearly decreases from a unitary power value to zero and the original inter-ramp right section FR0 nonlinearly increases from zero to the unitary power value. Then, the lowest power value H is determined. According to the first transmission power value K1, the second transmission power value K2 and the lowest power value H, the inter-ramp left section ratio SL0=K1−H and an inter-ramp right section ratio SR0=K2−H are calculated. After that, the original inter-ramp left section FL0 and the original inter-ramp right section FR0 are separately scaled into SL0*FL0 and SR0*FR0. Subsequently, the inter-ramp left section FL0'=H+(SL0/$2^N$)*(FL0*$2^N$) and the inter-ramp right section FR0'=H+(SR0/$2^N$)*(FR0*$2^N$) are calculated. Thus, as shown in FIG. 4B, the inter-ramp control curve having a concave shape is produced, and the power variation of the TX PA in the inter-ramp division can be effectively controlled. The inter-ramp control curve produced by the aforementioned controlling method is continuously connected with the power control curves for the former and the next slots. Besides, the inter-ramp left section FL0' is continuously connected to the inter-ramp right section FR0'.

In various embodiments, the former and next slots may comprise different modulation types (i.e., the first slot comprises a first modulation type and the second slot comprises a second modulation type different from the first modulation type), and a transition from the first modulation type to the second modulation type may occur when the output power between the data areas of the first and second slots (e.g., in the guard area) falls below a threshold value. For example, the first slot may use GMSK modulation, the second slot may use 8PSK modulation, and the threshold value may be between H and the lower of the output power values in the two slots. In one embodiment, the threshold value is about H+(p*Δ), where H is as described herein, Δ is the difference between H and the lower of the output power values in the two slots, and p is a value of from about 0.25 to about 0.5.

Figure 5B:
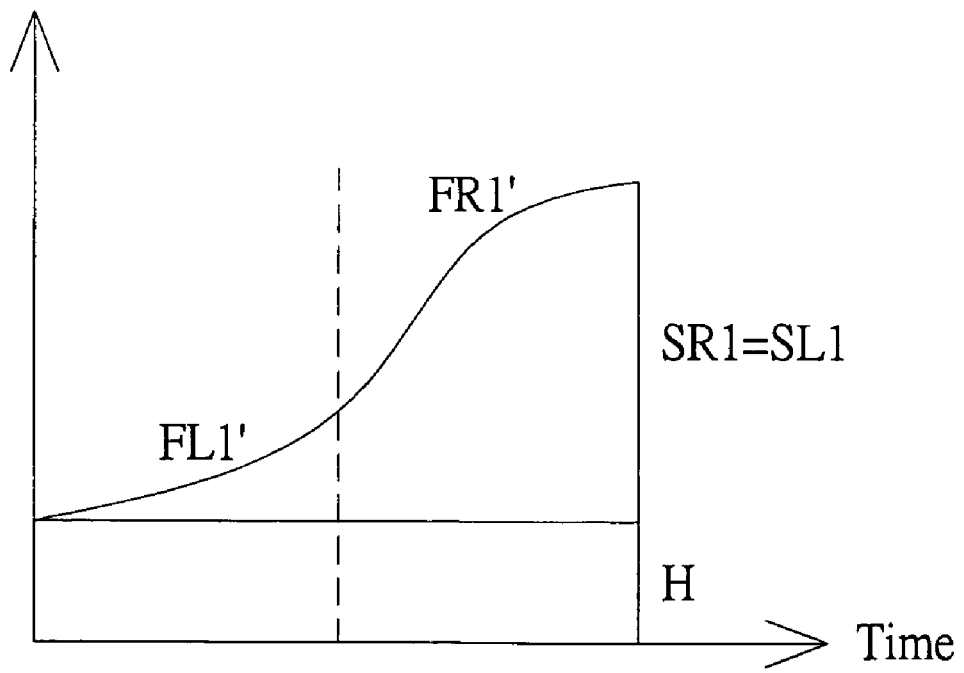
FIG. 5B shows a ramp-up control curve according to a preferred embodiment of the invention.

Referring to FIGS. 5A and 5B, the original ramp-up curve and the ramp-up control curve according to a preferred embodiment of the invention are shown. The ramp-up control curve is produced by the following steps. The original ramp-up curve is provided and is horizontally and equally divided into an original ramp-up left section FL1 and an original ramp-up right section FR1. As shown in FIG. 5A, the contours of the original ramp-up left section FL1 and the original ramp-up right section FR1 are unnecessary to be symmetric but have to correspond with the standard scopes of time domain and the frequency spectrum in order to avoid interference. The original ramp-up left section FL1 nonlinearly increases from zero, and the original ramp-up right section FR1 nonlinearly increases to a unitary power value. Besides, the original ramp-up left section FL1 is continuously connected to the original ramp-up right section FR1. Then, the lowest power value H is determined. According to the first transmission power value K1 and the lowest power value H, the ramp-up left section ratio SL1=K1−H and the ramp-up right section ratio SR1=K1−H are calculated. After that, the original ramp-up left section FL1 and the original ramp-up right section FR1 are scaled into SL1*FL1 and SR1*FR1. Subsequently, the ramp-up left section FL1'=H+(SL1/$2^N$)*(FL1*$2^N$) and the ramp-up right section FR1'=H+(SR1/$2^N$)*(FR1*$2^N$) are calculated. Thus, as shown in FIG. 5B, the nonlinear ramp-up control curve is produced, and the power variation of the TX PA in the ramp-up division can be effectively controlled. The ramp-up control curve produced by the aforementioned controlling method is continuously connected with the power control curve for the next time slot. Besides, the ramp-up left section FL1' is continuously connected to the ramp-up right section FR1'.

Figure 6B:
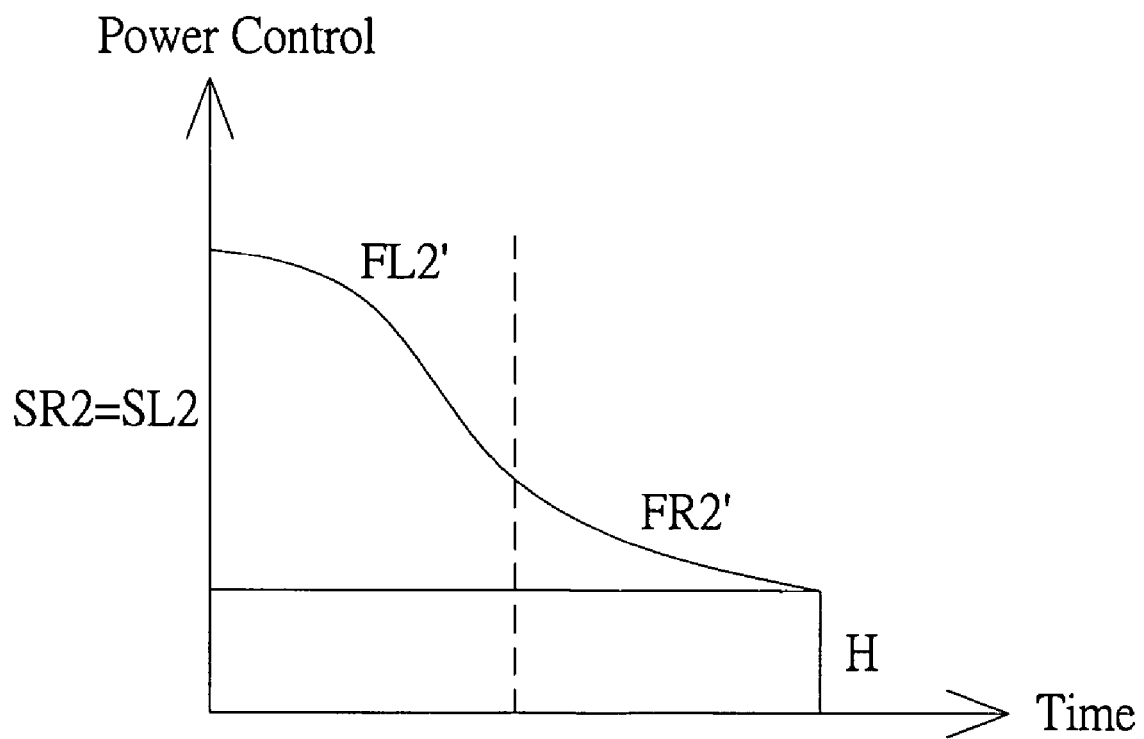
FIG. 6B shows a ramp-down curve according to a preferred embodiment of the invention.

Referring to FIG. 6A and FIG. 6B, the original ramp-down curve and the ramp-down control curve according to a preferred embodiment of the invention are shown. The ramp-down control curve is produced by the following steps. The original ramp-down curve is first provided and is horizontally and equally divided into an original ramp-down left section FL2 and an original ramp-down right section FR2. As shown in FIG. 6A, the contours of the original ramp-down left section FL2 and the original ramp-down right section FR2 are unnecessary to be symmetric but have to correspond with the standard scopes of time domain and the frequency spectrum in order to avoid interference. The original ramp-down left section FL2 nonlinearly decreases from a unitary power value, and the original ramp-down right section FR2 nonlinearly decreases to zero. Then, the lowest power value H is determined. According to the second transmission power value K2 and the lowest power value H, the ramp-down left section ratio SL2=K2−H and the ramp-down right section ratio SR2=K2−H are calculated. After that, the original ramp-down left section FL2 and the original ramp-down right section FR21 are scaled into SL2*FL2 and SR2*FR2. Subsequently, the ramp-down left section FL2'=H+(SL2/$2^N$)*(FL2*$2^N$) and the ramp-down right section FR2'=H+(SR2/$2^N$)*(FR2*$2^N$) are calculated. Thus, as shown in FIG. 6B, the nonlinear ramp-down control curve is produced, and the power variation of the TX PA in the ramp-down division can be effectively controlled. The ramp-down control curve produced by the aforementioned controlling method is continuously connected with the power control curve for the former time slot. Besides, the ramp-down left section FL2' is continuously connected to the ramp-down right section FR2'.

Figure 7:
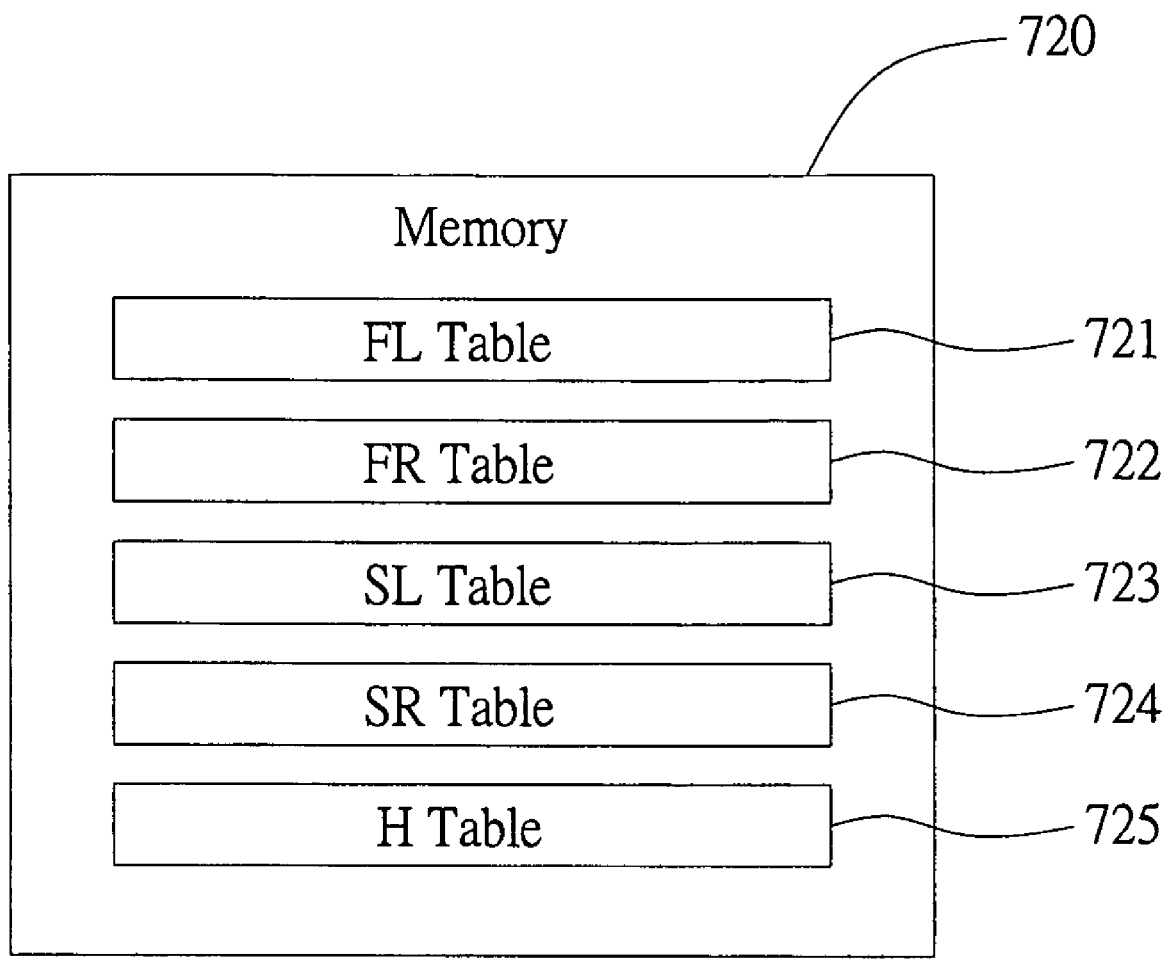
FIG. 7 shows a power controlling apparatus according to a preferred embodiment of the invention.

Referring to FIG. 7, a memory 720 is shown that includes an original left section table (FL table) 721, an original right section table (FR table) 722, a lowest power value table (H table) 725, a left section ratio table (SL table) 723, and a right section ratio table (SR table) 724. The original left section table 721 stores several original left sections, each of which corresponds to one transmission power value. The original right section table 722 stores several original right sections, each of which corresponds to one transmission power value.

The lowest power value table 725 stores several lowest power values, each of which corresponds to one transmission power value. The left section ratio table 723 stores several left section ratios, each of which corresponds to one transmission power value and one lowest power value. The right section ratio table 724 stores several right section ratios, each of which corresponds to one transmission power value and one lowest power value.

In practice, the lowest power values H, the left section ratios SL, the right section ratios SR, the original left sections FL, and the original right sections FR corresponding to various power amplitudes are separately stored in several tables. For example, the original left section table 721 for the original left sections FL, the original right section table 722 for the original right sections FR, the lowest power value table 725 for the lowest power values H, the left section ratio table 723 for the left section ratios SL, and the right section ratio table 724 for the right section ratios SR are stored in the memory 720. When different power amplitudes are applied, the system can rapidly obtain the corresponding values by searching the tables.

Regarding the usage of memory, instead of storing various power control curves in the memory in the prior art, the invention generates power control curves by scaling the original curves to decrease the required memory for storing. Regarding the calculation speed, the original left sections FL and the original right sections FR represented by values with float points will take tens of commands to perform operations, which cause unbearable operation complexity. In order to avoid that, the values stored in the original left section table 721 and the original right section table 722 are separately the products of multiplying the original left sections FL and the original right sections FR by the nth power of 2. That is to say, the values stored in the original left section table 721 and the original right section table 722 respectively satisfy FL_TABLE=FL*$2^N$ and FR_TABLE=FR*$2^N$. Therefore, the power controlling method searches the original left section table and the original right section table according to the transmission power value of the power variation area so as to obtain the corresponding original left section FL_TABLE and the corresponding original right section FR_TABLE for generating the original curve. When calculating the left section FL' and the right section FR' of the power control curve, the shift operations are performed to simplify the calculations. The calculation formulas include FL'=H+(FL_TABLE*SL) with shifting $N_1$ bits to the right, namely, FL'=H+(FL*$2^{N_1}$)*SL/$2^{N_1}$, and FR'=H+(FR_TABLE*SR) with shifting $N_2$ bits to the right, namely, FR'=H+(FR*$2^{N_2}$)*SR/$2^{N_2}$, where $N_1$ and $N_2$ are each independently an integer. Therefore, the binary shift operations can be applied to perform the multiplying operations for values with float points, which avoid the operation complexity. As compared with the conventional controlling method which performs linear operations for each point of the power control curve, the controlling method according to the invention performs multiplying and shifting operations on the original curve and therefore, is capable of rapidly produce the power control curve. Furthermore, the controlling apparatus according to the invention can use the co-processor for performing the multiplying and shifting operations so as to reduce the operation quantity and time.

The controlling method for the TX power amplifier according to the preferred embodiment of the invention nonlinearly connects the power control curve during the power transformation of the TX PA and forms the power control curve as a concave curve so as to reduce the power amplitude in the guard area for saving power. Further, by applying some specific operations, such as the binary shift operations, the power controlling apparatus according to the invention requires less memory and time to produce the power control curve for the TX PA, which has a specific shape, namely, the concave shape, complying with the standard scopes of time domain and frequency spectrum.

Figure 8:
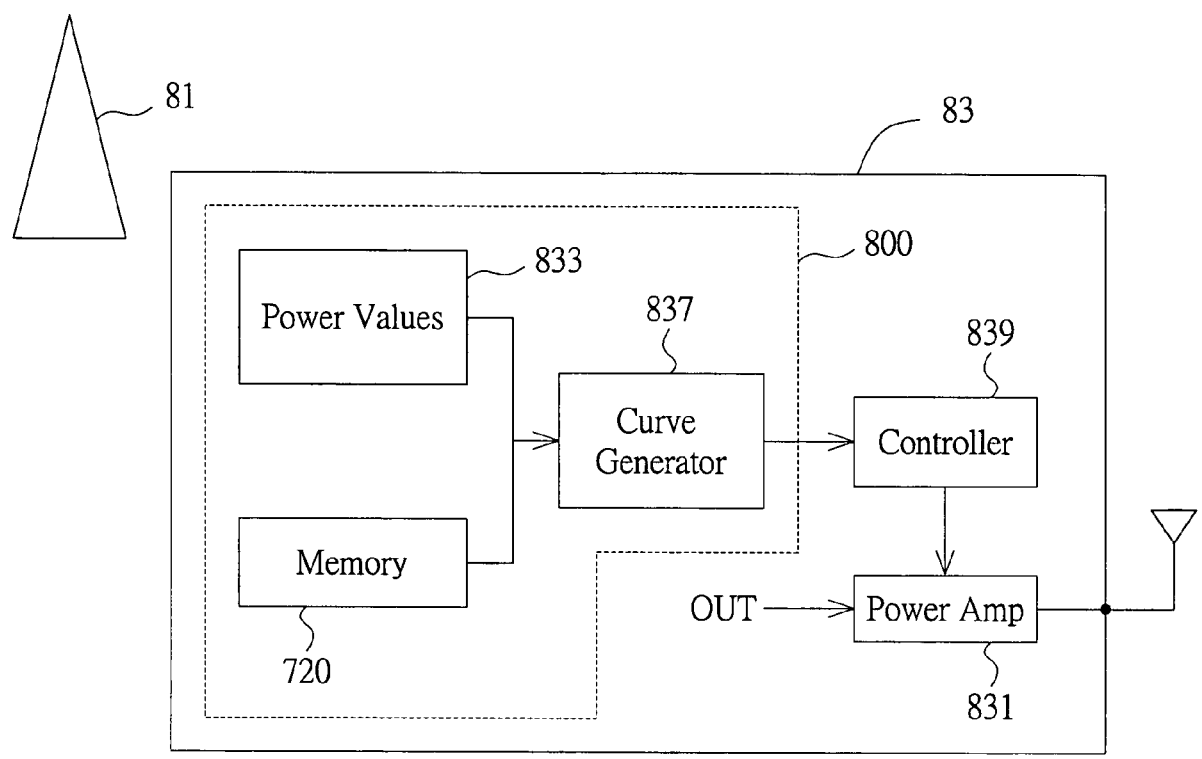
FIG. 8 shows a multi-slot wireless communication system according to a preferred embodiment of the invention.

As shown in FIG. 8, a multi-slot wireless communication system is provided. The system includes a base station 81 and a mobile unit 83. The mobile unit 83 communicates with the base station 81 by a plurality of slots. The mobile unit 83 includes a transmission power amplifier 831 configured to amplify an output signal (e.g., OUT), a power controlling apparatus 800 and a controller 839. The power controlling apparatus 800 includes a device 833 configured to provide a first power value SL at a first time point in a first slot and a second power value SR at a second time point in a second slot, where the second slot is adjacent to the first slot; a memory 720 (e.g., as mentioned with regard to FIG. 7) configured to store and/or provide at least one original power curve; and a curve generator 837, connected to the device 833 and the memory 835, configured to generate an output power curve according to the original power curve between the first time point and the second time point, where at least one power value Q of the output power curve is substantially less than each of the first power value SL and the second power value SR. The controller 839, coupled to the curve generator 837 and the transmission power amplifier 831, is generally configured to adjust the output power of the transmission power amplifier 831 according to the output power curve.

To improve the data transmission rate without damaging data, the EDGE wireless communication system provides users with an option to adopt different types of modulation schemes (e.g., either 8PSK or GMSK). Basically, if the channel quality is good (e.g., it meets or exceeds certain thresholds or criteria for channel quality), the EDGE system may adopt 8PSK to modulate data, so that more data can be transmitted per unit time (e.g., per slot time). However, if the channel quality is not sufficiently good for 8PSK modulation, the EDGE system may choose the GMSK modulation scheme for data transmission, so that data will not be easily damaged.

Figure 9:
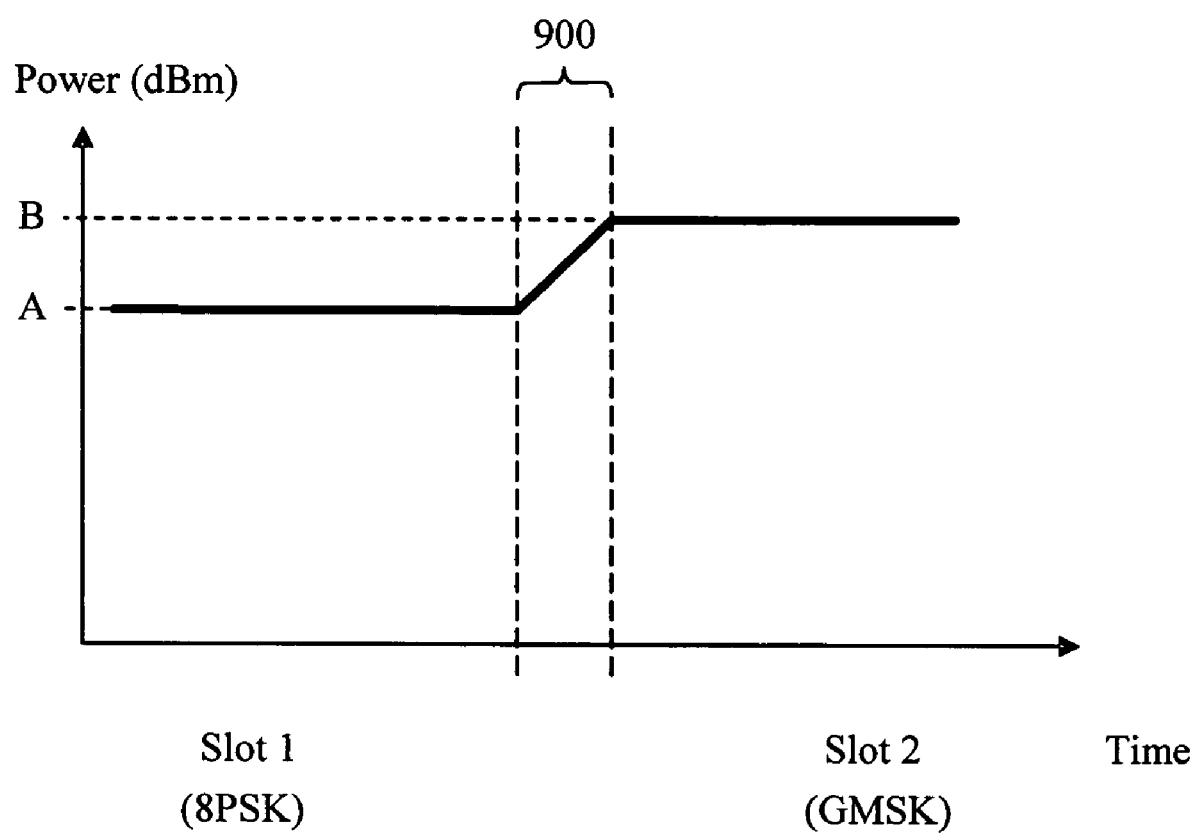
FIG. 9 shows a ramp-up output power curve according to a conventional mixed modulation (e.g., EDGE) wireless communication device or system.

Therefore, two adjacent time slots may be modulated by different modulation schemes. As shown in FIG. 9, Slot 1 is modulated by the 8PSK scheme, and Slot 2 is modulated by the GMSK scheme. The power value in Slot 1 is A and the power value in Slot 2 is B. Conventionally, there is an inter-slot ramp region 900 where no physical data is transmitted, but where the power value is increased from A to B in preparation for transmission in Slot 2.

Figure 10:
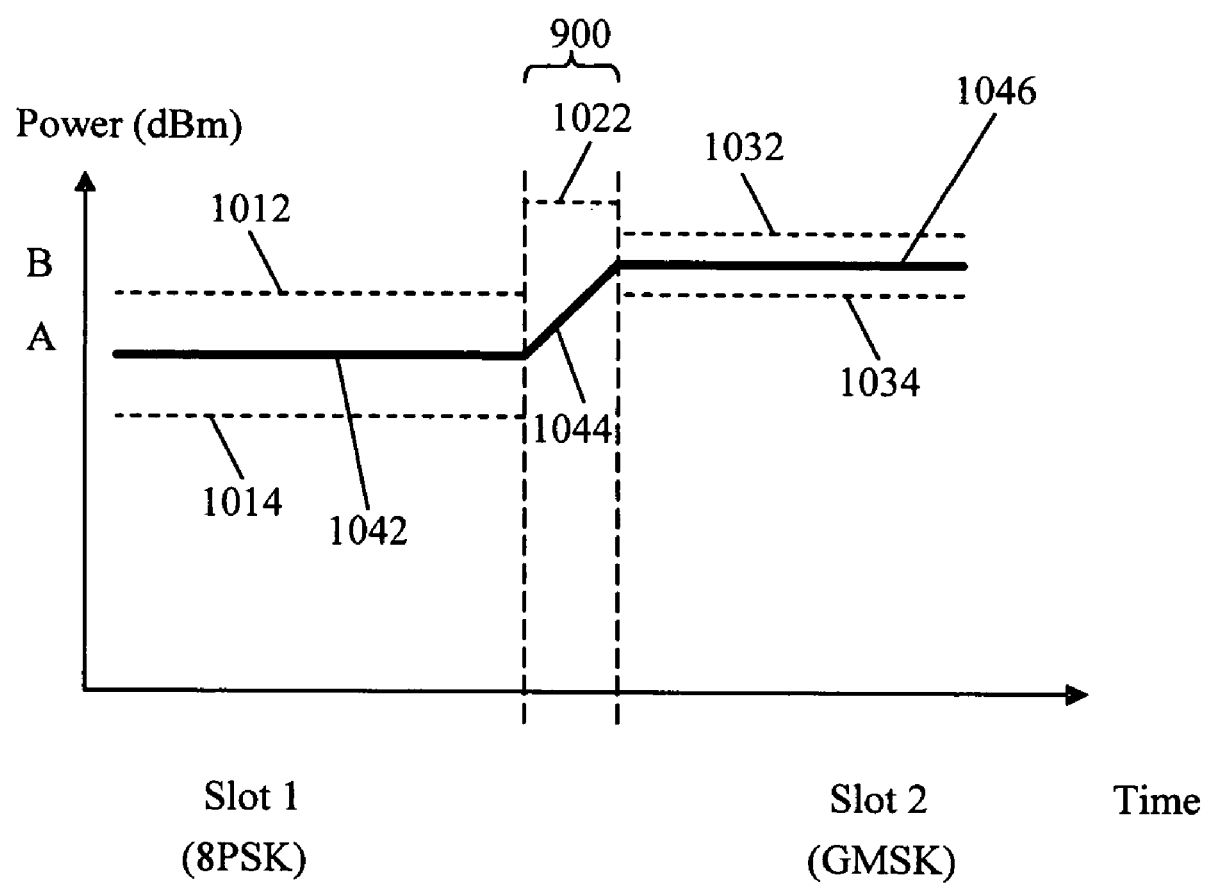
FIG. 10 shows an output power curve in adjacent 8PSK-modulated and GMSK-modulated slots in a conventional mixed modulation (e.g., EDGE) wireless communication device.

FIG. 10 shows a graph 1000 of power as a function of time for such a mixed modulation system. Dotted lines 1012-1014 (in Slot 1, using 8PSK modulation), 1022 (in inter-slot region 900), and 1032-1034 (in Slot 2, using GMSK modulation) constitute a timing mask for the mixed modulation system, the parameters of which are defined by the GSM/GPRS/EDGE specification(s). According to the timing mask defined in the GSM/GPRS/EDGE specification(s), each output power value shall be under a predetermined maximum power value and/or over a predetermined minimum power value (e.g., lines 1012, 1014, 1022, 1032, and 1034). In other words, the output power values (depicted by solid lines 1042, 1044 and 1046) cannot exceed the timing mask (depicted by the dotted lines 1012, 1014, 1022, 1032, and 1034).

Referring back to FIG. 9, the conventional way to control the power value in the inter-slot ramp region 900 is by linearly point-by-point increasing the power value up to the power value B. As shown in FIG. 9, in the inter-ramp region 900, conventional technology forms a linear power line that directly links the power value A to the power value B. However, transients may occur in the inter-ramp region 900 using the conventional approach, as shown in FIGS. 11A-B.

Figures 11A, 11B:
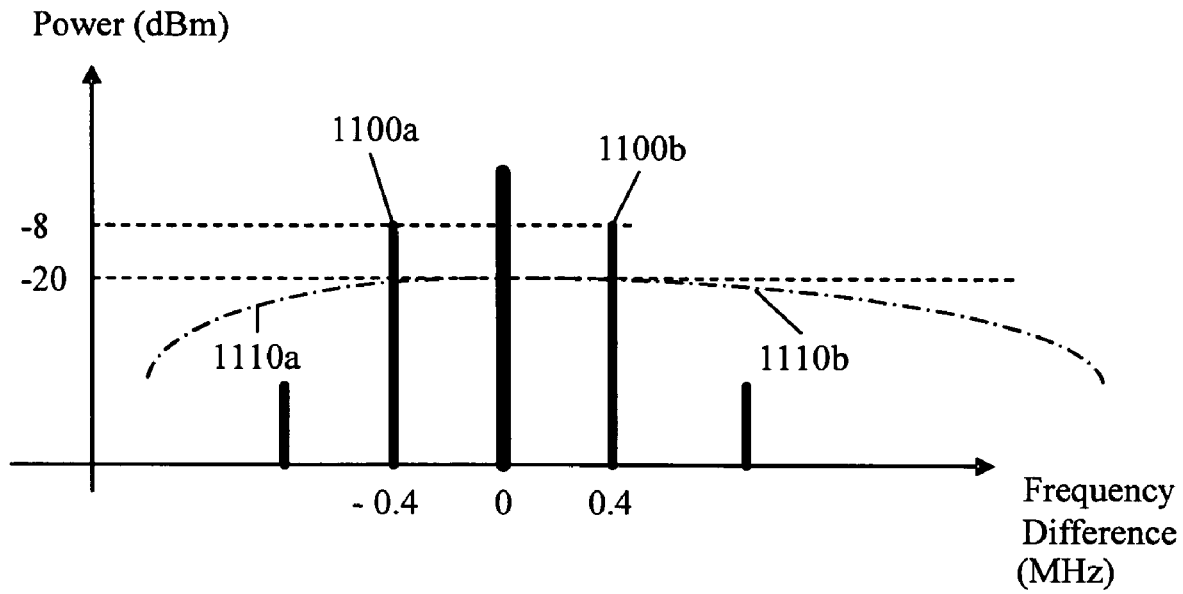
FIGS. 11A-B are graphs depicting the effect of a high-power transient on the output power of a conventional mixed modulation wireless communication device during an inter-ramp region.

FIGS. 11A-B show where a transient 1100 occurs in frequency and time domains, respectively. As shown in FIG. 11A, in the inter-slot ramp region 900, the power values of transient pilot 1100a-b are over the mask 1110a-b (dotted lines). It is known that if the pilots 1100a-b are over the mask 1100a-b, interference with the adjacent channel(s) which may be used by other mobile communications devices (e.g., cellular telephones) will result. And, as shown in FIG. 11B, a high peak (transient) 1100 occurs during inter-slot ramp region 900 at frequencies 0.4 MHz from the transmission channel. FIG. 11B is a graph of the power for the indicated frequency as a function of time. One can therefore determine in which part of the inter-ramp profile (e.g., in the inter-slot region 900) the high transient 1100 will occur by referring to such a graph. As shown in FIG. 11B, the power value of the high peak is over −20 dBm, which is undesired and which is generally out of tolerance.

To solve the problems that may result from such transients, the present invention provides a method and apparatus to form a concave curve in the inter-slot (ramp) region so that no transient having a power exceeding a predetermined maximum (e.g., that of a timing/power mask) will occur therein. For example, in one embodiment, the present invention concerns a method of reducing transients in an inter-slot region of a communications protocol, involving the following steps:

1. Determine the output power values (e.g., for all time points) in the inter-slot ramp region based on a concave power curve, such that some power value in the inter-slot ramp region is lower than power values of the signal in the first slot immediately before the inter-slot region and/or the second slot immediately after the inter-slot region. The power curve is not a linear curve like the conventional inter-slot ramp curve of FIG. 9, although it may contain one or more substantially linear sections or portions.
2. Configure or generate the concave curve such that the lowest point (i.e., the lowest power value) occurs substantially where the transient will occur and is below a threshold value (e.g., a predetermined power value). Generally, the lowest point of the concave curve occurs in the middle of the inter-slot (ramp) region.
3. Generate the concave curve using (e.g., from) at least one reference curve, as described elsewhere herein. In one embodiment, the concave curve comprises a combination of reference curves FL(t) and FR(t), as described elsewhere herein.

Figure 12:
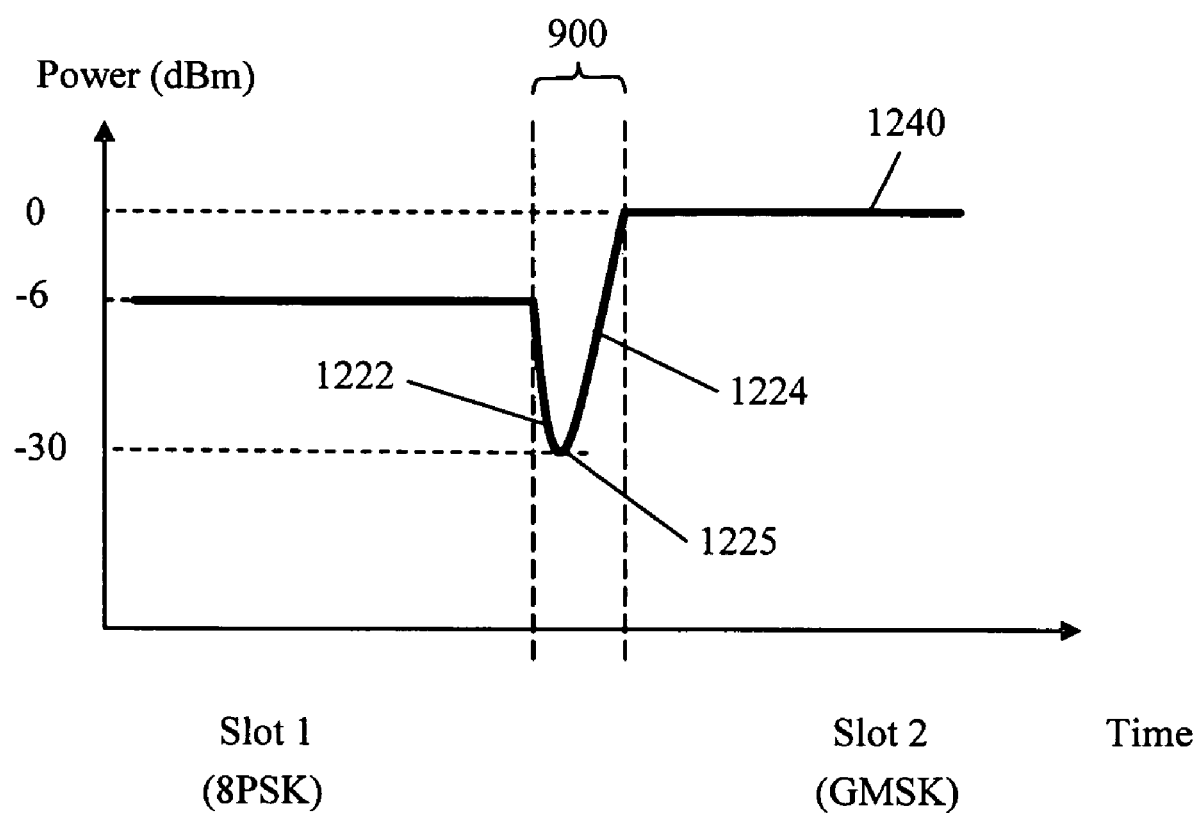
FIG. 12 is a graph exemplifying an embodiment of the present invention and depicting the effects thereof on the output power of a mixed modulation wireless communications system during an inter-ramp period.

FIG. 12 shows a graph of output power as a function of time for a mixed modulation wireless communications system during the inter-slot ramp period 900 for one embodiment of the present invention. Immediately before inter-slot region 900, output power curve 1240 has a first power value of about −6 dBm in Slot 1 (using 8PSK modulation). Immediately after inter-slot region 900, output power curve 1240 has a second power value of about 0 dBm in Slot 2 (using GMSK modulation). However, in inter-slot region 900, output power curve 1240 is generally concave, and has a first (or left), decreasing section 1222, a second (or right), increasing section 1224, and a minimum power value 1225 of about −30 dBm. In some embodiments, the threshold for the lowest point 1225 on the power curve 1240 in the inter-slot region 900 may be set at −6 dBm, −10 dBm or even −20 dBm or more below the lower of the first and second power values of the power curve 1240 immediately before and immediately after the inter-slot region 1220. Assuming that the threshold is −20 dBm, as shown in FIG. 12, the lowest point (the minimum power value 1225) is clearly below the threshold.

Figure 13A:
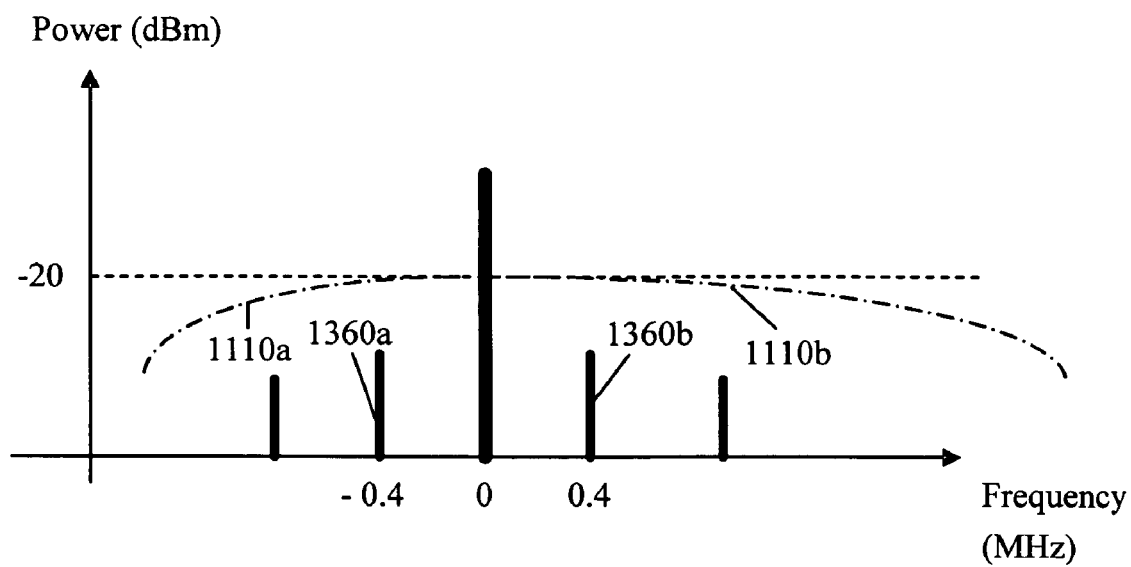
FIGS. 13A-B are graphs showing output power as a function of frequency variation from the output frequency, and output power as a function of time for a given output frequency variation, respectively, for an embodiment of the present invention.
Figure 13B:
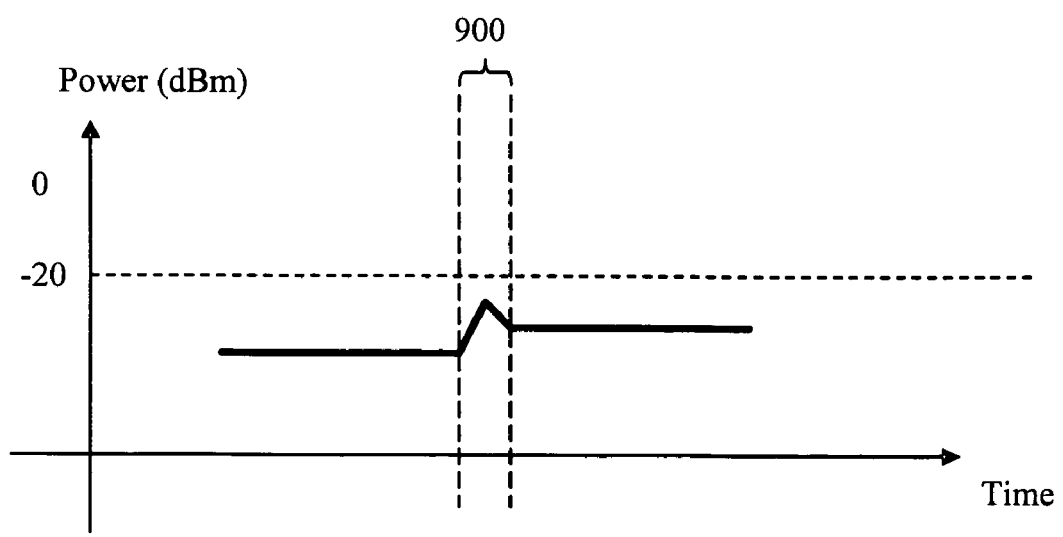

FIGS. 13A-B further show the results provided by the present invention. FIG. 13A contains a first graph showing output power as a function of frequency, and FIG. 13B contains a second graph showing output power as a function of time at a given output frequency (in this case, for the transient at δ=0.4 MHz). In the first graph, the power values of transients 1360a-b separately located at +/−0.4 MHz are clearly below the power values defined by mask 1110a-b. Thus, as shown in FIG. 13A-B, the output power curve in the inter-slot region 900 has a lower peak (with power value under −20 dBm), in comparison with the peak (with power value over −20 dBm) shown in FIG. 11B of the conventional system, thereby reducing or preventing any interference that could occur in adjacent channels as a result of a relatively high-power transient.

Figure 14:
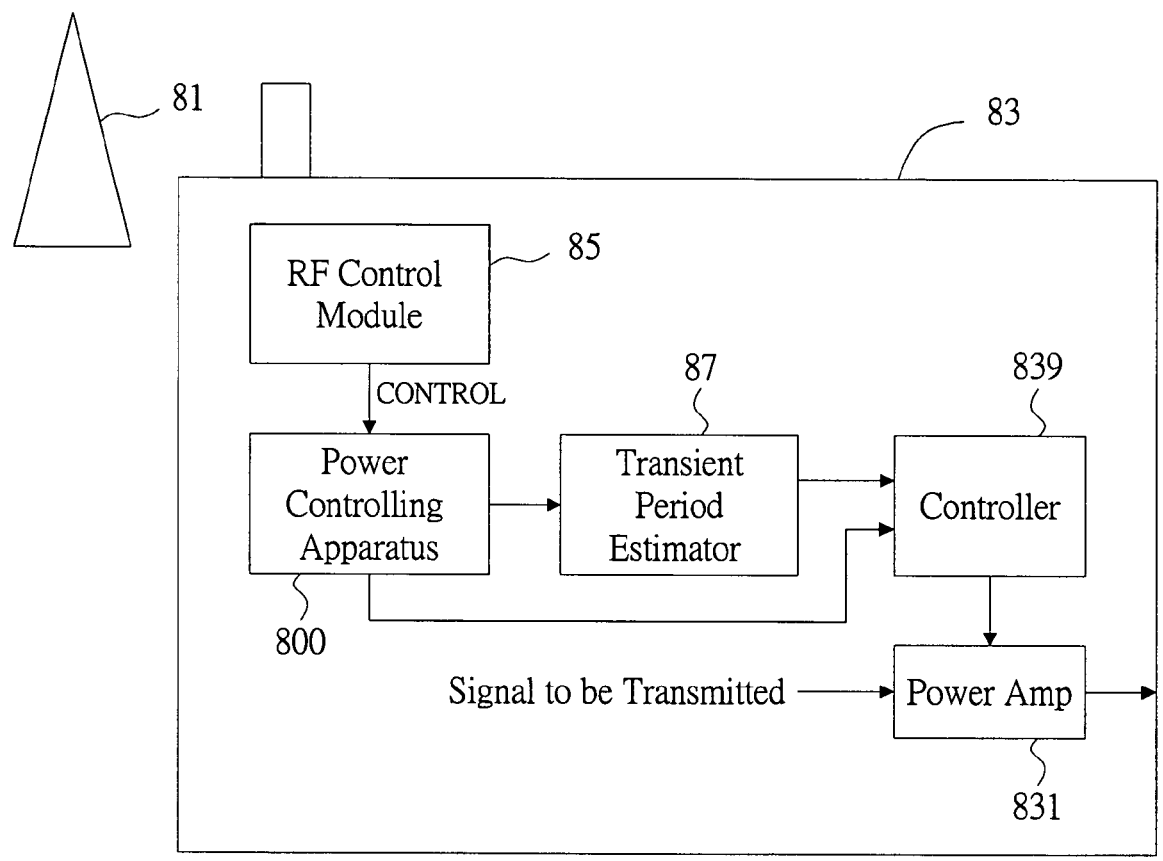
FIG. 14 shows an exemplary mobile unit embodied by the present invention.

FIG. 14 shows another embodiment of the mobile unit 83. As shown in FIG. 14, besides the power controlling apparatus 800, the controller 839, and the power amplifier 831 mentioned above, the mobile unit 83 further has a RF control module 85 and a transient period estimator 87. The RF control module 85, the power controlling apparatus 800, the transient period estimator 87, or the controller 839 can be wholly or separately implemented in a microprocessor or one or more devices (e.g., integrated circuits) in a physical layer. It should be noted that the controller 839 can (1) adjust the output power of the power amplifier 831 according to the output power curve, and also (2) control switching of the power value/modulation type between two adjacent slots (e.g., from a first modulation type in a first slot to a second modulation type in a second, adjacent slot). To control modulation type switching, the controller 839 may further include a general purpose output (GPO) device or a 3-wire command unit.

In a TDMA communication system, the RF control module 85 receives signals from base station 81 and outputs a control signal (e.g., CONTROL in FIG. 14) to the power controlling apparatus 800. The control signal contains some or all feature information of each slot in a subsequent data frame. The feature information may include the power value for each slot in the data frame, the location of each slot (from which one may identify, determine or locate the inter-slot ramps between adjacent slots), and/or the modulation type of each slot in the data frame.

For example, the control signal informs the power controlling apparatus 800 that, with reference to FIG. 12, the required power value in Slot 1 should be A (about −6 dBm) and the required power value in Slot 2 should be B (about 0 dBm). The power controlling apparatus 800 then configures or generates an output power curve for the inter-slot region 900 between Slot 1 and Slot 2, wherein at least one output power value of the output power curve is substantially less than the power values A and B. After the output power curve is generated, the transient period estimator 87 further estimates and/or determines a transient period within the output power curve (and in the inter-slot region 900) where all power values are lower than a predetermined threshold value. In some embodiments, the transient period includes the period or time where the lowest point in the output power curve occurs. Therefore, during the transient period of the output power curve, the controller 839 will control the output power value of the power amplifier 831 of the mobile unit 83 and switch from power value A to power value B (and/or enable switching from the first modulation type to the second modulation type).

Thus, besides controlling the power value switching between slots, in an EDGE communication system, the mobile unit 83 can also be used to control the modulation type switching between slots. For example, the control signal may inform the power controlling apparatus 800 that, as shown in FIG. 12, the required modulation type in Slot 1 is 8PSK and the required modulation type in Slot 2 is GMSK. The power controlling apparatus 800 then configures or generates an output power curve for the inter-slot region 900 between Slot 1 and Slot 2, wherein at least one output power value of the output power curve is substantially less than the power value A and B. After the output power curve is generated, the transient period estimator 87 further estimates/determines a transient period within the output power curve (and in the inter-slot region 900) where all power values are lower than a predetermined threshold value. In some embodiments, the transient period includes the period or time where the lowest point in the output power curve occurs. Therefore, during the transient period of the output power curve, the controller 839 can enable the power amplifier 831 to switch the modulation type from 8PSK (Slot 1) to GMSK (Slot 2).

Therefore, by switching the power value/modulation type within the transient period, the transients that may result from such power value/modulation type switching also occur within the transient period and are also controlled by the power reducing method and apparatus described herein. As shown in FIG. 13, the occurrence of a transient means that the output power value sharply increases and decreases so as to form a peak, having a relatively high power value. Since the output power value(s) within the transient period may be either the lowest power value or less than a threshold value, the power value of the peak caused by the transient is controlled and will not exceed the timing mask, regardless of any sharp increase therein.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of controlling output power in an inter-slot region of a multi-slot wireless communication device, comprising:
   providing a first power value in a first slot at a first time immediately before the inter-slot region;
   providing a second power value in a second slot at a second time immediately after the inter-slot region, wherein the second slot is adjacent to the first slot and the second slot uses a different modulation type than the first slot;
   determining a first original power curve in accordance with the first slot;
   determining a second original power curve in accordance with the second slot; and
   configuring or generating an output power curve in the inter-slot region according to the original power curves, wherein at least one output power value of the output power curve is substantially less than each of the first power value and the second power value.

2. The method of claim 1, wherein the output power curve comprises a first portion and a second portion, and the method further comprises:
   generating a first portion of the output power curve from the first original power curve; and
   generating a second portion of the output power curve from the second original power curve.

3. The method of claim 2, wherein generating the first portion of the output power curve comprises performing a first mathematical operation on the first original power curve and the first power value, and generating the second portion of the output power curve comprises performing a second mathematical operation on the second original power curve and the second power value.

4. The method of claim 3, wherein the first mathematical operation comprises adding a predetermined power value to at least one of the first original power curve and the first power value, and the second mathematical operation comprises adding the predetermined power value to at least one of the second original power curve and the second power value.

5. The method of claim 4, wherein generating the first portion of the output power curve further comprises multiplying the first original power curve and the first power value, and generating the second portion of the output power curve further comprises multiplying the second original power curve and the second power value, wherein the first power value and/or and the second power value may have the predetermined power value added thereto.

6. The method of claim 4, wherein the predetermined power value is below a threshold value.

7. The method of claim 6, wherein the threshold value is at least 6 dBm less than a smaller of the first power value and the second power value.

8. The method of claim 2, wherein:
   generating the first portion of the output power curve comprises scaling the first original power curve in accordance with the first power value; and
   generating the second portion of the output power curve comprises scaling the second original power curve in accordance with the second power value.

9. The method of claim 2, wherein:
   generating the first portion of the output power curve comprises scaling the first original power curve in accordance with the first power value and a lowest power value between the first time point and the second time point; and
   generating the second portion of the output power curve comprises scaling the second original power curve in accordance with the second power value and the lowest power value between the first time point and the second time point.

10. The method of claim 1, further comprising:
    storing control information in a memory, and
    generating the original power curves from the control information.

11. The method of claim 10, wherein each of the original power curves comprises a function:
    $[1+\cos(2\pi*n/N)]/2$,
    where n and N are numerical values from the control information.

12. The method of claim 1, wherein the original power curves comprise polynomial functions.

13. The method of claim 1, wherein the output power curve comprises a concave curve.

14. The method of claim 1, wherein the system comprises an EDGE-compliant communication system.

15. The method of claim 14, wherein the first slot comprises one of a 8PSK and a GMSK modulation type and the second slot comprises the other of the 8PSK and the GMSK modulation type.

16. An apparatus for controlling output power in an inter-slot region of a multi-slot wireless communication device, comprising:

a device configured to provide (i) a first power value in a first slot at a first time immediately before the inter-slot region and (ii) a second power value in a second slot at a second time immediately after the inter-slot region, wherein the second slot is adjacent to the first slot and the second slot uses a different modulation type than the first slot;

an output curve generator configured to determine a first original power curve in accordance with the first slot, determine a second original power curve in accordance with the second slot, and configure or generate an output power curve according to the original power curves; and a controller configured to adjust the output power in the inter-slot region according to the output power curve, wherein at least one output power value of the output power curve is substantially less than the first power value and the second power value.

17. The apparatus of claim 16, further comprising a memory configured to provide the original power curves.

18. The apparatus of claim 17, wherein the memory further stores control information for the original power curves.

19. The apparatus of claim 18, further comprising an original curve generator configured to generate the original power curves according to:

[1+COS(2π*n/N)]/2, where n and N are numerical values from the control information.

20. The apparatus of claim 17, wherein the original power curves comprise polynomial functions.

21. The apparatus of claim 16, wherein the output power curve comprises a concave curve.

22. An EDGE-compliant communication system, comprising the apparatus of claim 16.

23. The apparatus of claim 16, wherein the system comprises an EDGE-compliant communication system, the first slot comprises one of an 8PSK or a GMSK modulation type, and the second slot comprises the other of the 8PSK or GMSK modulation type.

24. The apparatus of claim 16, wherein the device further comprises a transmission power amplifier.

25. A mobile phone, comprising the apparatus of claim 16.

26. The mobile phone of claim 25, wherein the apparatus is part of an integrated circuit (IC) therein.

27. The apparatus of claim 16, wherein the output curve generator is further configured to:
generate a first portion of the output power curve in accordance with the first original power curve; and
generate a second portion of the output power curve in accordance with the second original power curve.

28. The apparatus of claim 27, wherein the output curve generator is further configured to:
scale the first original power curve in accordance with the first power value to generate the first portion of the output power curve; and
scale the second original power curve in accordance with the second power value to generate the second portion of the output power curve.

29. The apparatus of claim 27, wherein the output curve generator is further configured to:
scale the first original power curve in accordance with the first power value and a lowest power value between the first time point and the second time point to generate the first portion of the output power curve; and
scale the second original power curve in accordance with the second power value and the lowest power value between the first time point and the second time point to generate the second portion of the output power curve.

30. A multi-slot wireless communication system, comprising:
a base station; and
a mobile unit configured to communicate with the base station by a plurality of slots, comprising:
a transmission power amplifier;
a device configured to provide (i) a first power value in a first slot at a first time immediately before an inter-slot region and (ii) a second power value in a second slot at a second time immediately after the inter-slot region, wherein the second slot is adjacent to the first slot and the second slot uses a different modulation type than the first slot;
a memory configured to provide a first original power curve in accordance with the first slot and a second original power curve in accordance with the second slot;
a curve generator, connected to the measurement device and the memory, configured to generate an output power curve in the inter-slot region according to the original power curves, wherein at least one output power value of the output power curve is substantially less than the first power value and the second power value; and
a controller, coupled to the curve generator and the transmission power amplifier, configured to adjust the output power of the transmission power amplifier according to the output power curve.

31. The multi-slot wireless communication system of claim 30, wherein the multi-slot wireless communication system is an EDGE-compliant communication system.

32. The multi-slot wireless communication system of claim 31, wherein the first slot has one of an 8PSK and a GMSK modulation type and the second slot has the other of the 8PSK and GMSK modulation type.

33. The multi-slot wireless communication system of claim 30, wherein the curve generator is further configured to:
generate a first portion of the output power curve in accordance with the first original power curve; and
generate a second portion of the output power curve in accordance with the second original power curve.

34. The multi-slot wireless communication system of claim 33, wherein the curve generator is further configured to:
scale the first original power curve in accordance with the first power value to generate the first portion of the output power curve; and
scale the second original power curve in accordance with the second power value to generate the second portion of the output power curve.

35. The multi-slot wireless communication system of claim 33, wherein the curve generator is further configured to:
scale the first original power curve in accordance with the first power value and a lowest power value between the first time point and the second time point to generate the first portion of the output power curve; and
scale the second original power curve in accordance with the second power value and the lowest power value between the first time point and the second time point to generate the second portion of the output power curve.

36. A method of controlling output power in an inter-slot region of a multi-slot wireless communication device, comprising:
providing a first power value in a first slot at a first time immediately before the inter-slot region;
providing a second power value in a second slot at a second time immediately after the inter-slot region, wherein the second slot is adjacent to the first slot and the second slot uses a different modulation type than the first slot;

generating a first portion of an output power curve from a first original power curve, wherein generating the first portion of the output power curve comprises performing a first mathematical operation on the first original power curve and the first power value and the first mathematical operation comprises adding a predetermined power value to at least one of the first original power curve and the first power value;

generating a second portion of the output power curve from a second original power curve, wherein generating the second portion of the output power curve comprises performing a second mathematical operation on the second original power curve and the second power value and the second mathematical operation comprises adding the predetermined power value to at least one of the second original power curve and the second power value; and adjusting said an output power in the inter-slot region according to the output power curve, wherein at least one output power value of the output power curve is substantially less than each of the first power value and the second power value.

* * * * *

UNITED STATES PATENT AND TRADEMARK OFFICE
CERTIFICATE OF CORRECTION

PATENT NO. : 7,489,909 B2  
APPLICATION NO. : 11/147152  
DATED : February 10, 2009  
INVENTOR(S) : Shine C. Huang Page 1 of 1

It is certified that error appears in the above-identified patent and that said Letters Patent is hereby corrected as shown below:

On the title page, after the section (65) entitled "Prior Publication Data," insert:

-- Related U.S. Application Data

(62)   Division of application No. 11/124,476, filed on May 6, 2005, now Pat. No. 7,489,908, which is a division of application No. 11/047,032, filed on Jan. 31, 2005, now Pat. No. 7,486,938.

(30)   Foreign Application Priority Data

Jun. 18, 2004   (TW).................................................................................................93117810 --

Signed and Sealed this  
First Day of May, 2012

David J. Kappos  
*Director of the United States Patent and Trademark Office*